United States Patent [19]

Watanabe

[11] Patent Number: 5,259,111
[45] Date of Patent: Nov. 9, 1993

[54] METHOD OF PRODUCING TERMINAL FOR BASE BOARD

[75] Inventor: Tamio Watanabe, Shizuoka, Japan

[73] Assignee: Yazaki Corporation, Tokyo, Japan

[21] Appl. No.: 964,305

[22] Filed: Oct. 21, 1992

[30] Foreign Application Priority Data

Oct. 31, 1991 [JP] Japan .................. 3-286014

[51] Int. Cl.$^5$ ............................................ H01R 43/16
[52] U.S. Cl. ...................................... 29/885; 29/739; 29/845; 29/874
[58] Field of Search ................. 29/739, 845, 885, 874, 29/884

[56] References Cited

U.S. PATENT DOCUMENTS

| | | | |
|---|---|---|---|
| 3,769,679 | 11/1973 | Kendall | 29/739 X |
| 4,216,576 | 8/1980 | Ammon et al. | 29/845 |
| 4,799,589 | 1/1989 | Peleckis | 29/845 X |
| 4,975,084 | 12/1990 | Fedder et al. | |
| 5,015,207 | 5/1991 | Koepke | 29/885 X |
| 5,163,223 | 11/1992 | Wurster | 29/874 |

FOREIGN PATENT DOCUMENTS 58-25091 2/1983 Japan .
675496 12/1985 Japan .

OTHER PUBLICATIONS

Proceedings of 28th Electronic Components Conference Anaheim, Calif. 24-26 Apr. 1978, pp. 121-128 by Brown.

Primary Examiner—Carl J. Arbes
Attorney, Agent, or Firm—Sughrue, Mion, Zinn, Macpeak & Seas

[57] ABSTRACT

A plurality of terminals each serving to fixedly mounting a connector housing on a printed circuit base board are successively produced by punching a single metallic plate of which opposite surface are coated with plated layers by actuating a press machine. Each terminal includes an electrical contact portion adapted to come in electrical contact with an opponent terminal at one end part, a fixing portion for fixedly securing the terminal to a connector housing at the intermediate part, and a base board connecting portion at other end part thereof. Each of the electrical connecting portion and the base board connecting portion has a rectangular sectional shape while the plated layers are kept alive thereon as they are. The base board connecting portion is plastically deformed to a cylindrical base board connecting portion having a circular sectional shape in the hollow space between a pair of press-forming die halves by actuating a press machine, causing the plated layer to extend around the substantially whole periphery of the cylindrical base board connecting portion. Subsequently, the cylindrical base board connecting portion is inserted through a circular base board connecting hole and it is then soldered to the base board around the periphery of the circular base board connecting hole with excellent connectability of the terminal to the base board.

2 Claims, 2 Drawing Sheets

METHOD OF PRODUCING TERMINAL FOR BASE BOARD

BACKGROUND OF THE INVENTION

The present invention relates generally to a method of producing a terminal for a printed circuit base board wherein the terminal is fixedly connected to the base board by inserting it in a terminal connecting hole and then soldering it to the base board. More particularly, the present invention relates to improvement of a method of the foregoing type wherein soldering connectability to the base board around the periphery of a soldered part is substantially improved.

To facilitate understanding of the present invention, a conventional method of the foregoing type as disclosed in an official gazette of Japanese Patent Laid-Open Publication NO. 58-25091 will be described below with reference to FIG. 4 to FIG. 6. FIG. 4 is a perspective view of a metallic plate and terminals for fixedly securing a connector housing to a printed circuit base board, FIG. 5 is a sectional view of the base board and the connector housing, particularly showing that the connector housing is fixedly mounted on the base board using terminals as shown in FIG. 4, and FIG. 6 is a fragmentary plan view of the base board, particularly showing that a base board connecting portion of the terminal is taken along line A—A in FIG. 5.

Referring to FIG. 4, terminals each generally designated by reference numeral 11 are successively produced by punching a single metallic plate 12 by actuating a press machine (not shown). As shown in FIG. 4, the terminal 11 includes an electrical contact portion 9 having a rectangular sectional shape at the upper part, a base board connecting portion 6 having a rectangular sectional shape at the lower part and a fixing portion 13 at the intermediate part thereof. Referring to FIG. 5, the electrical contact portion 9 is adapted to come in electrical contact with a mating terminal (not shown), the base board connecting portion 6 is connected to a printed circuit base board 3, and the fixing portion 13 is fixedly secured to a connector housing 2. Plated layers 5 previously deposited on the opposite surfaces 12a and 12b of the metallic plate 12 are left alive after completion of each punching operation as they are.

As is apparent from FIG. 5, the terminals 11 are fixedly secured to a bottom wall 13 of the connector housing 2 by press-fitting or integral molding, and the base board connecting portions 6 are connected to the base board 3 by inserting them into terminal connecting holes 4 on the base board 3 and then soldering them to a circuit 14 at 15. As shown in FIG. 6, each terminal connecting hole 4 is formed in the shape of a circular hole in consideration of insertion of the terminal 11 having a rectangular sectional shape without any specific orientation as well as easiness of the formation thereof.

With the conventional terminal 11 constructed in the above-described manner, however, due to the facts that when the base board connecting portion 6 is inserted into the terminal connecting hole 4, a distance (gap) $S_1$ between one corner of the base board connecting portion 6 and the circuit 12 largely differs from a distance $S_2$ (gap) between one flat surface of the base board connecting portion 6 and the circuit 14, and moreover, the base board connecting portion 6 is provided with only two plated layers 5 on the opposite surfaces thereof, there arises a problem that the base board connecting portion 6 is connected to the base board 3 by soldering with low connectability, resulting in the electrical connection therebetween being achieved with low reliability. To improve the connectability at the soldered parts, it is thinkable that each of four surfaces of the base board connecting portion 6 is coated with a plated layer 5. In this case, there arises another problem that each terminal 11 is fixedly connected to the base board 3 at an increased cost because of a necessity for subjecting the terminal to plating again.

SUMMARY OF THE INVENTION

The present invention has been made in consideration of the aforementioned background.

An object of the present invention is to provide a method of producing a terminal for a printed circuit base board wherein connectability of the terminal to the base board around the periphery of a soldered part can substantially be improved without any particular increase in cost.

In order to attain the above-noted and other objects, the present invention provides a method of producing a terminal for electrical connection, comprising the steps of: punching a metallic strip of which opposite surfaces are coated with plated layers and forming at least one terminal having a substantially rectangular cross-sectional shape with the plated layers kept remained on opposite two surfaces of the terminal; and plastically deforming at least a portion of the terminal into a substantially circular cross-sectional shape while substantially circumscribing the portion of the terminal by the plated layers on the portion.

The present invention, further provides a method of producing a terminal for a printed circuit base board, comprising the steps of: punching a metallic plate of which opposite surfaces are coated with plated layers so as to successively form a plurality of terminals each including an electrical contact portion at the end thereof and a base board connecting portion at the other end thereof, each of the electrical contact portion and the base board connecting portion having a rectangular sectional shape while the plated layers are kept alive thereon as they are; placing the base board connecting portion between a pair of press-forming die halves, each having a semicylindrical forming groove; and plastically deforming the base board connecting portion to a cylindrical base board connecting portion having a circular sectional shape and allowing the plated layers to extend around substantially whole periphery of the cylindrical base board connecting portion.

In accordance with the present invention, since the base plate connecting portion of the terminal is formed into the circular cross-section, a gap between the base plate connecting portion and the circular terminal connecting portion of the printed circuit base board is reduced in distance and made constant. Further, since the rectangular base plate connecting portion is plastically deformed into the circular base plate connecting portion by using press-forming die halves each having a semicylindrical forming groove, the plated layer is formed around the entire surface of the base plate connecting portion without any additional plating process.

With the method of the present invention practiced in the above-described manner, connectability of each terminal to the base board around the periphery of the soldered part can substantially be improved without any particular increase in cost.

Other objects, features and advantages of the present invention will become apparent from reading of the following description which has been prepared in conjunction of the drawings.

BRIEF DESCRIPTION OF THE DRAWINGS

The present invention is illustrated in the following drawings in which.

DESCRIPTION OF THE PREFERRED EMBODIMENT

The present invention will now be described in detail hereinafter with reference to the accompanying drawings which illustrate a method of producing a terminal for a printed circuit base board in accordance with a preferred embodiment of the present invention.

Figure 1:
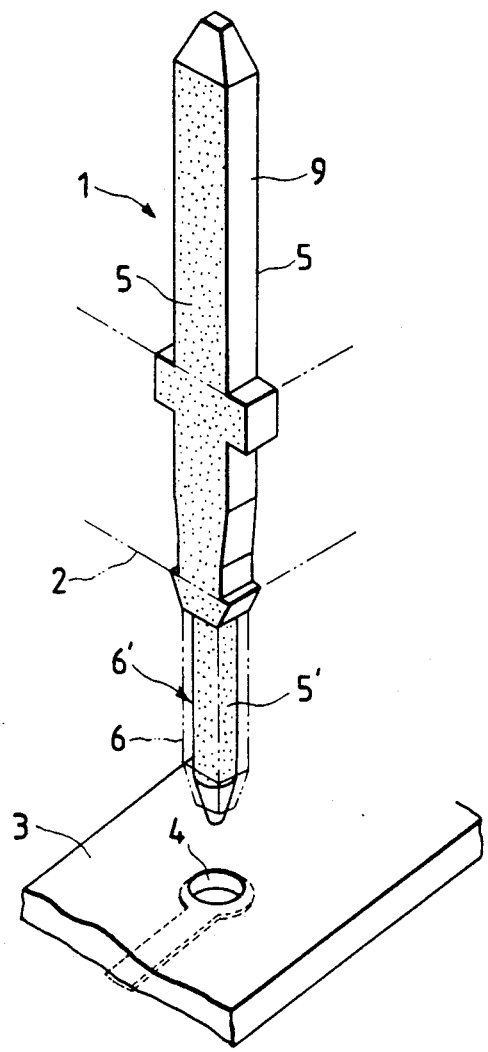
FIG. 1 is a perspective view of a terminal for a printed circuit base board produced by employing a method in accordance with an embodiment of the present invention, particularly showing that the terminal is ready to be inserted into a terminal connecting hole on the base board.

In FIG. 1, reference numeral 1 designates a terminal for fixedly mounting a connector housing on a printed circuit base board wherein the terminal 1 is produced by employing the method of the present invention. Specifically, the terminal 1 includes an electrical contact portion 9 at the upper end part and a base board connecting portion 6' at the lower end part thereof. The base board connecting portion 6' will be described in detail later. In addition, reference numeral 2 designates a connector housing to which the intermediate part of the terminal 1 is fixedly secured, and reference numeral 3 designates a printed circuit base board which has a circular terminal connecting hole 4 formed thereon.

Figure 4:
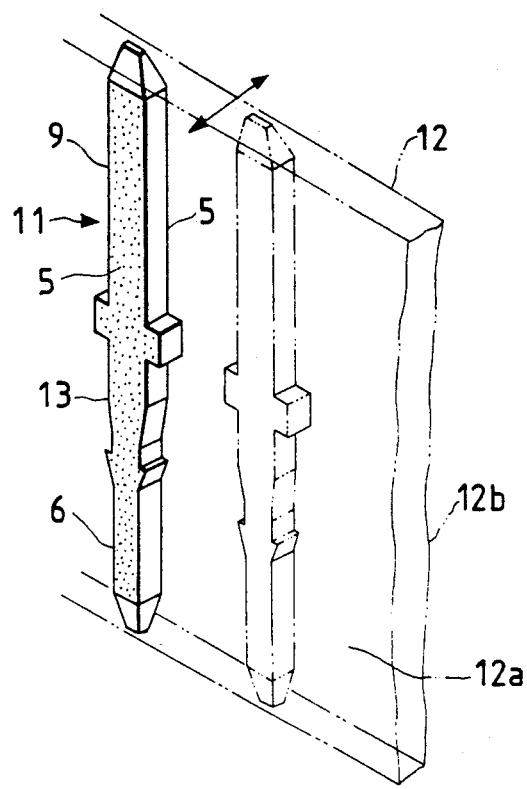
FIG. 4 is a perspective view of a metallic plate and terminals for fixedly mounting a connector housing on a printed circuit base board wherein the terminals are produced by employing a conventional method.
Figure 6:
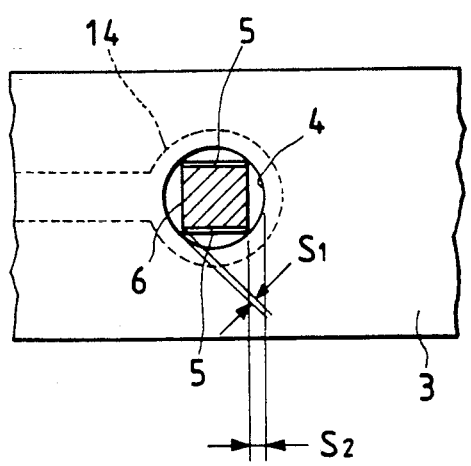
FIG. 6 is a fragmentary plan view of the base board, particularly showing that a base board connecting portion of a terminal is taken along line A—A in FIG. 4.
Figure 5:
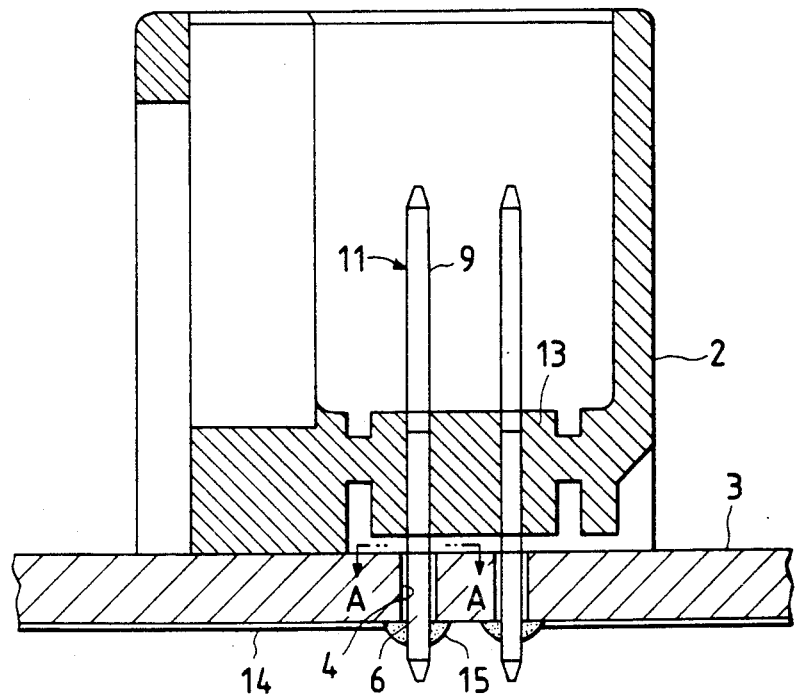
FIG. 5 is a vertical sectional view of the base board, particularly showing that a connector housing is fixedly mounted on the base board using two terminals.

In practice, the terminal 1 is produced in the substantially same manner as the conventional method described above with reference to FIG. 4 to FIG. 6 with the exception of plastic deformation of plated layers 5 as will be described later.

First, a metallic plate of which opposite surfaces are coated with plated layers 5 (see FIG. 4) is subjected to punching to successively form terminals 1 each having a rectangular sectional shape. Subsequently, a base board connecting portion 6' of the terminal 1 having a rectangular sectional shape is plastically deformed to exhibit a circular sectional shape. In other words, a characterizing feature of the present invention consists in that the base board connecting portion 6 is plastically deformed to a cylindrical base board connecting portion 6' so that plated layers 5' extends around the substantially whole periphery of the cylindrical base board connecting portion 6'.

Next, description will be made below with reference to FIG. 2 as to how the cylindrical base board connecting portion 6' is formed by employing the method of the present invention.

Figure 2:
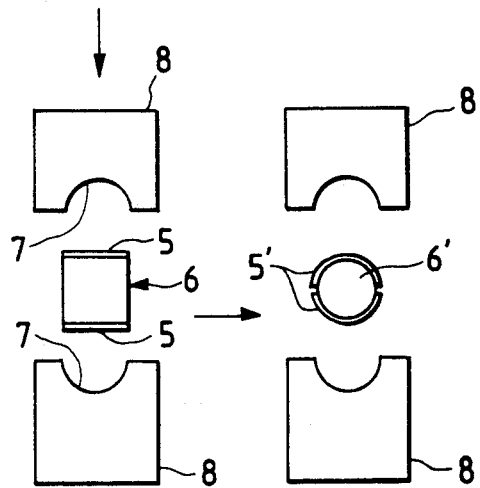
FIG. 2 is illustrative views which show that a base board connecting portion of the terminal is subjected to press-forming.

First, the base board connecting portion 6 having a rectangular sectional shape is placed in the hollow space between a pair of press-formed die halves 8 each having a semicylindrical forming groove 7 in such a manner that the plated layers 5 on the opposite surfaces of the base board connecting portion 6 are located opposite to the semicylindrical forming grooves 7 (see a left half in FIG. 2). Subsequently, the upper press-formed die half 8 is lowered by actuating a press machine (not shown) so that the base board connecting portion 6 is subjected to press-forming until it is plastically deformed to the cylindrical base board connecting portion 6' (see a right half in FIG. 2).

As is best seen in FIG. 1, on completion of the press-forming operation, the base board connecting portion 6 represented by two-dot chain lines are plastically deformed to the column-shaped base board connecting portion 6' having a circular sectional shape represented by solid lines. Consequently, the plated layers 5' extend around the substantially whole periphery of the cylindrical base board connecting portion 6'.

Figure 3:
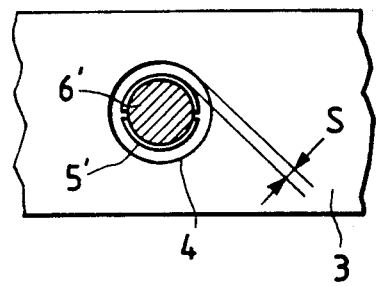
FIG. 3 is a fragmentary plan view of the base board, particularly showing that the press-formed base board connecting portion of the terminal is inserted into a base board connecting hole.

FIG. 3 shows that the connector housing 2 is fixedly mounted on the base board 3 and the cylindrical base board connecting portion 6' of the terminal 1 is then inserted through a circular terminal connecting hole 4 on the base board 3. As is apparent from the drawing, the cylindrical base board connecting portion 6' is received in the circular terminal connecting hole 4 while an annular gap S having a constant width is formed therebetween. While the foregoing received state is maintained, the terminal 1 is fixedly secured to the base board 3 by soldering the plated layers 5' to the base board 3 around the periphery of the circular terminal receiving hole 4. Thus, connectability of the terminal to the base board around the periphery of the soldered part can substantially be improved.

While the present invention has been described above merely with respect to a single preferred embodiment thereof, it should of course be understood that the present invention should not be limited only to this embodiment but various change or modification may be made without departure from the scope of the present invention as defined by the appended claims.

What is claimed is:

1. A method of producing a terminal for a printed circuit base board, comprising the steps of:

punching a metallic plate of which opposite surfaces are coated with plated layers so as to successively form a plurality of terminals each including an electrical contact portion at one end thereof and a base board connecting portion at the other end thereof, each of said electrical contact portion and said base board connecting portion having a rectangular sectional shape;

placing said base board connecting portion between a pair of press-forming die halves, each having a semicylindrical forming groove; and plastically deforming said base board connection portion, by moving said die halves toward each other, to a cylindrical base board connecting portion having a circular sectional shape and allowing said plated layers to extend substantially around the whole periphery of said cylindrical base board connecting portion.

2. A method of producing a terminal for electrical connection, comprising the steps of:

punching a metallic strip of which opposite surfaces are coated with plated layers and forming at least one terminal having a substantially rectangular cross-sectional shape with said plated layers remaining on opposite two surfaces of said terminal; and plastically deforming at least a portion of said terminal into a substantially circular cross-sectional shape while substantially circumscribing said portion of said terminal by said plated layers on said portion.

* * * * *